United States Patent [19]

McPherson

[11] 4,322,822

[45] Mar. 30, 1982

[54] HIGH DENSITY VMOS ELECTRICALLY PROGRAMMABLE ROM

[76] Inventor: Roger K. McPherson, 12707 Murphy Rd., Lot 68, Stafford, Tex. 77477

[21] Appl. No.: 626

[22] Filed: Jan. 2, 1979

[51] Int. Cl.³ .............................................. G11C 11/40
[52] U.S. Cl. .................................. 365/182; 307/279; 365/103
[58] Field of Search .............. 365/174, 182, 183, 184, 365/185, 103; 307/238, 279

[56] References Cited

U.S. PATENT DOCUMENTS

| | | | |
|---|---|---|---|
| 3,091,754 | 5/1963 | Nazare | 365/96 |
| 3,245,051 | 4/1966 | Robb | 365/96 |
| 3,641,516 | 2/1972 | Castrucci et al. | 365/96 |
| 3,979,612 | 9/1976 | Mudge et al. | 307/303 |
| 4,109,270 | 8/1978 | Von Basse et al. | 307/303 |
| 4,116,720 | 9/1978 | Vinson | 307/303 |
| 4,156,289 | 5/1979 | Hoffman et al. | 365/182 |

OTHER PUBLICATIONS

"Outlook" Electronics Products Magazine, p. 17, Nov. 1979.
IBM Tech. Dis. Bul., vol. 20, No. 10, Mar. 78, "V--Grooved Charge-Coupled Device" K.K.liu p. 3851.

Primary Examiner—Terrell W. Fears
Attorney, Agent, or Firm—John G. Graham

[57] ABSTRACT

An electrically programmable memory array is made by a process in which the memory elements are capacitor devices formed in anisotropically etched V-grooves to provide enhanced dielectric breakdown at the apex of the groove. After breakdown, a cell exhibits a low resistance to a grounded substrate. Access transistors in series with the memory elements have control gates which also form address lines. The oxide thickness in the V-groove may be thinner than the gate oxide thickness for the access transistor providing a lower programming voltage. These factors provide a very small high speed device.

12 Claims, 6 Drawing Figures

HIGH DENSITY VMOS ELECTRICALLY PROGRAMMABLE ROM

BACKGROUND OF THE INVENTION

This invention relates to semiconductor memory devices and methods of manufacture, and more particularly to a programmable read only memory (PROM).

Nonvolatile memory devices of the PROM type at the present time usually are bipolar fusable link elements such as shown in pending application Ser. No. 900,550, filed May 1, 1978, assigned to Texas Instruments. This technique requires about 30 mA at 15 v to blow out the metal alloy link which provides the memory element. The access time of these devices is degraded because of the physically large transistors necessary to handle the programming power on the chip. Also, reliability problems can result from partial programming due to failure of the decoding circuitry on the chip to deliver the needed power.

It is the principal object of this invention to provide an improved programmable memory. Another object is to provide a PROM of reduced cell size which uses less power for programming. An additional object is to provide a dense array of PROM cells, made by a more efficient method. A further object is to provide a higher speed PROM.

SUMMARY OF THE INVENTION

In accordance with an illustrative embodiment of the invention a programmable memory array is provided which has a capacitor type structure in a V-shaped groove as the memory element. The electric field is enhanced at the apex of the groove so the dielectric breaks down at the point at a lower voltage than planar oxide. The element is voltage sensitive, rather than current as in fusable link devices. The power required to program a cell is perhaps one-hundredth that of the fusable link type, 0.3 mW vs. 30 mW. The cell size is small, less than one mil square; the peripheral circuitry is also smaller since it need not handle excessive power. The impedence of a cell is perhaps ten megohm or more unprogrammed, or less than 500 ohm after breakdown of the dielectric.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENTS

Figure 1:
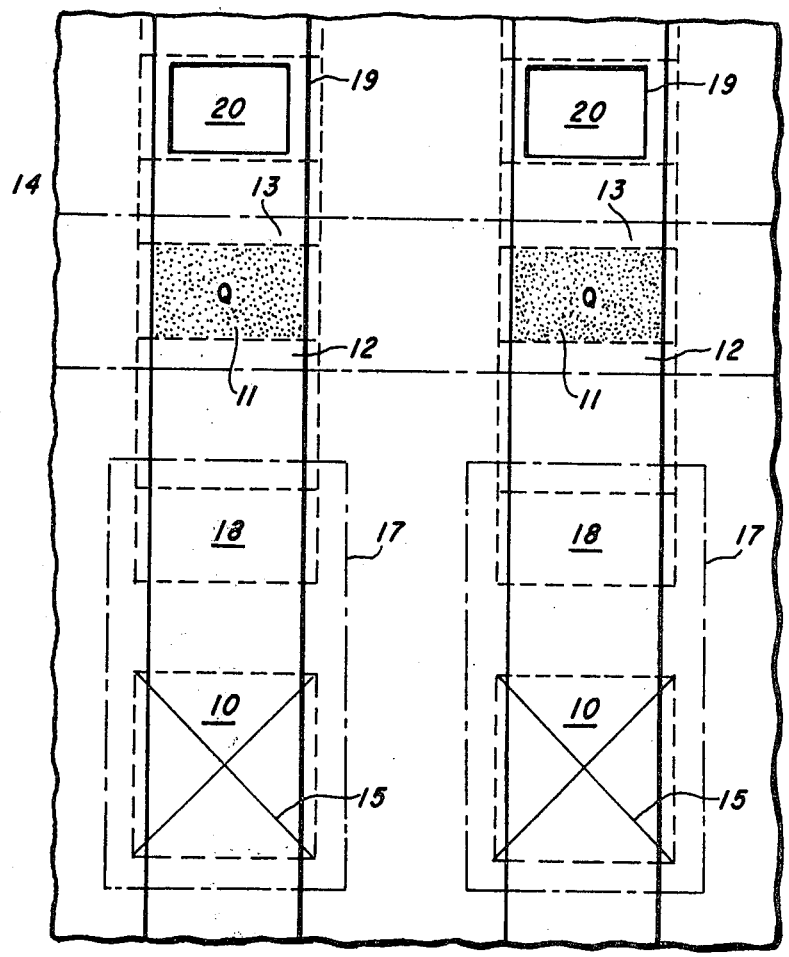
FIG. 1 is a greatly enlarged plan view of a small portion of a semiconductor chip showing the physical layout of a part of a PROM array made according to the invention.
Figure 2:
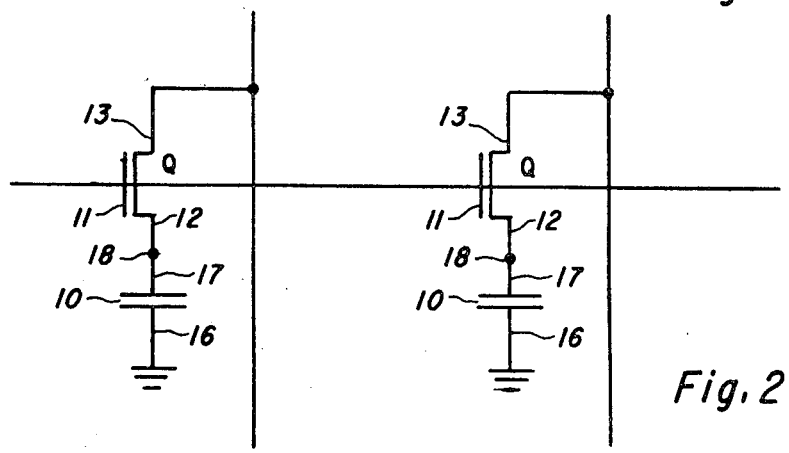
FIG. 2 is an electrical schematic diagram of the PROM of FIG. 1.
Figure 3:
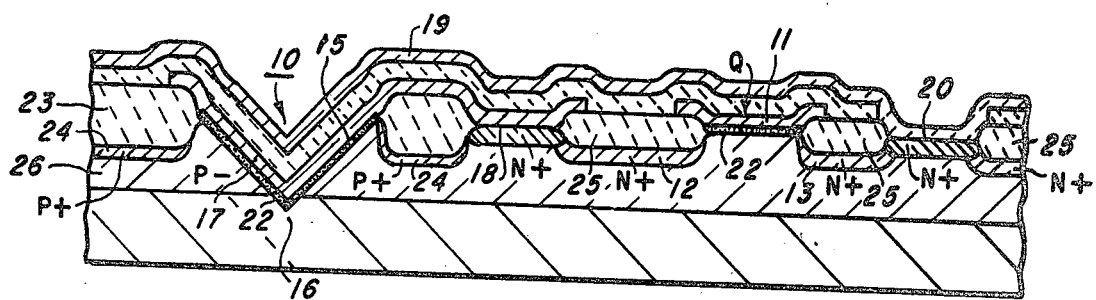
FIG. 3 is an elevation view in section of the cell of FIG. 1, taken along the line 3—3

With reference to FIGS. 1, 2, and 3, an electrically programmable read only memory is illustrated which is made according to the invention. The array consists of a large number of cells having storage elements 10, only two of which are shown. Each cell has an MOS access transistor Q having a control gate 11, a source 12 and a drain 13. The gates 11 are parts of a polysilicon strip 14 which is one of the X address lines for the array. The storage elements 10 are capacitor-like devices formed in anisotropically etched V-grooves 15. The lower part of the storage elements are N+ regions 16 connected to ground or Vss, while the upper parts are polycrystalline silicon layers 17 connected to the sources 12 at poly-to-moat contacts 18. The drains of the access transistors Q are N+ diffused regions which are connected to output lines 19 at metal-to-moat contacts 20. The array, formed on a silicon bar 21, would typically contain perhaps 16K bits on a bar less than about 150 mils on a side, depending upon the bit density. The two cells shown would be on a minute part of the bar, perhaps about one mil wide. A 16K PROM would require 128 of the X address lines 14 and 128 of the Y lines like the lines 19, providing 16,384 bits.

The cell array is programmed by current through the dielectric layer 22 of each capacitor 10 caused by application of high voltage to a selected one of the metal strips 19 and application of a high voltage to a selected one of the polycrystalline silicon strips 14 to render permanently conductive the selected one of the cells. The electric field is intensified at the apex of the V-groove so the oxide will break down preferentially at this point. The breakdown voltage is less than that for planar silicon oxide of the same thickness. The oxide thickness 22 in the V-groove 15 may be thinner than the gate oxide of the transistor Q, further reducing the voltage needed for irreversible rupture of the oxide. The rupture voltage is a very tight distribution of perhaps ±1.5 v for a 25 volt nominal programming voltage, when the oxide thickness is controlled to ±50 Å.

A thick field oxide coating covers parts of the bar not occupied by the transistors, V-groove, contacts or diffused interconnects, and P+ channel stop regions 24 are formed underneath all the thick field oxide. A thinner field oxide coating 25 covers the N+ diffused regions 12 and 13. A thick glaze oxide coating 28 provide interlevel insulation between the polysilicon and metal levels.

Figure 4A:
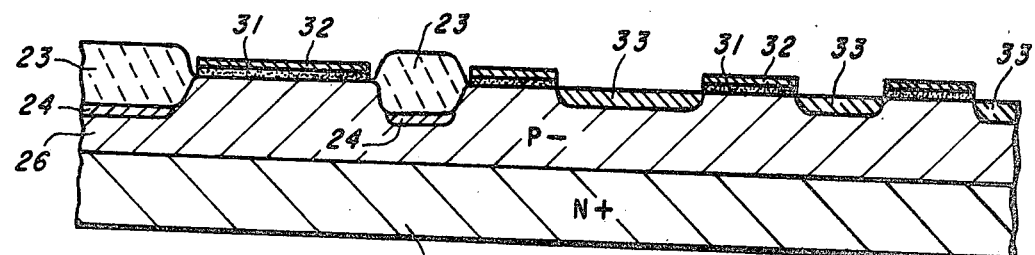
FIGS. 4a–4c are elevation views in section of the PROM device of FIGS. 1 and 3, at successive stages in the manufacturing process, taken generally along the line 3—3 in FIG. 1.
Figure 4B:
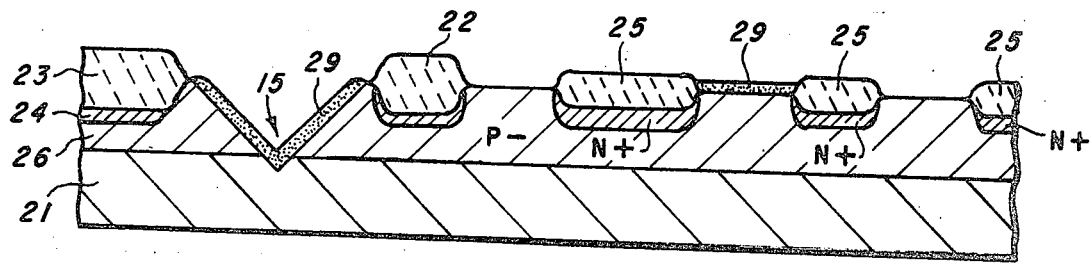
Figure 4C:
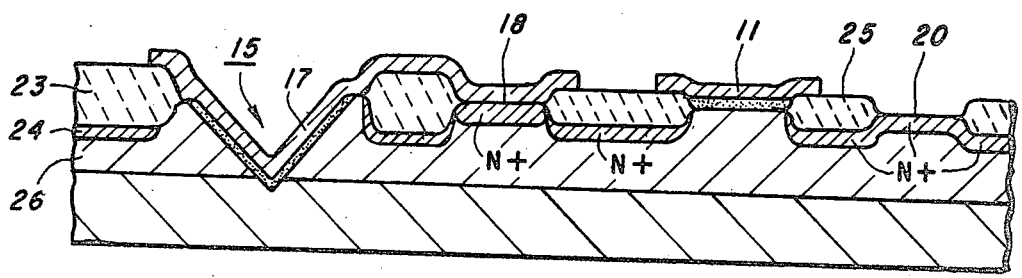

Turning now to FIGS. 4a–4c, a process for making the PROM array of the invention will be described. The starting material is a slice of N-type monocrystalline silicon, typically three or four inches in diameter and twenty mils thick, cut on the (100) plane, heavily doped N type. As above, in the FIGURES the portion shown of the bar 21 represents only a very small part of the slice, perhaps about one mil wide. First, an epitaxial layer 26 is grown to provide a lightly doped P-surface region of about 0.5 mil thickness. Next, the slice is oxidized by exposing to oxygen in a furnace at an elevated temperature of perhaps 1000 degrees C. to produce an oxide layer 31 on top of the epitaxial layer 26 over the entire slice of a thickness of about 400 Å. Next, a layer 32 of silicon nitride of about 1000 Å thickness is formed over the entire slice by exposing to an atmosphere of trichlorsilane and ammonia in a reactor. A coating of photoresist is applied to the top surface of the slice, then exposed to ultraviolet light through a mask which defines the desired pattern of the thick field oxide 23 and the P+ channel stop 24. The resist is developed, leaving areas where nitride is then etched away, leaving in place the oxide layer 31.

Using photoresist and nitride as a mask, the slice is now subjected to an ion implant step to produce the channel stop regions 24, whereby boron atoms are introduced into unmasked regions of silicon. Usually the slice would be subjected to a nitrogen anneal treatment after implant but prior to field oxide growth, as set forth in U.S. Pat. No. 4,055,444 assigned to Texas Instruments.

The next step in the process is formation of the initial part of the field oxide 23, which is done by subjecting the slices to steam or an oxidizing atmosphere at above about 900° or 1000° C. for perhaps, several hours. This causes a thick field oxide layer 23 to be grown as seen in FIG. 4a. This region extends into the silicon surface because silicon is consumed as it oxidizes. The remaining parts of the nitride layer 32 mask oxidation. The thickness of this layer 23 is about 5000 Angstroms, about half of which is above the original surface and half below. The boron doped P+ regions formed by implant will be partly consumed, but will also diffuse further into the silicon ahead of the oxidation front to product P+ field stop regions 24. At this point, the field oxide layer 23 is not merely as thick as it will be in the finished device.

The slice is now coated with another photoresist layer and then exposed to ultraviolet light through a mask which defines the source and drain areas 12 and 13 as well as other areas which are to be N+ diffused. After developing the photoresist, the slice is again subjected to a nitride etchant which removes the parts of the nitride layer 32 now exposed by holes in the photoresist. The parts of the oxide layer 31 exposed when this nitride is removed are then etched away to expose bare silicon. A phosphorus diffusion produces the N+ regions 33 which will subsequently become the sources, drains, etc. Instead of diffusion, these N+ regions 33 may be formed by arsenic ion implant, in which case the oxide layer 31 would be left in place and an anneal step used before the subsequent oxidation.

Referring to FIG. 4b, a second field oxidation step is now performed by placing the slice in steam or dry oxygen at about 1000° C. for several hours. This oxidizes all of the top of the slice not covered by the remaining parts of the nitride layer 32, producing field oxide 25 which is about 5000 Ångstroms thickness. During this oxidation, the areas of field oxide 23 grow thicker, to perhaps 10,000 Ångstroms. The N+ regions 33 are partly consumed but also diffuse further into the silicon ahead of the oxidation front to create the heavily doped regions 12, 13, etc.

The V-groove 15 is now formed by removing the nitride and oxide 31 from this area using a photoresist mask, then subjecting the slice to an etchant which removes the <100> surface of the silicon, stopping when it reches a <111> surface. This produces a V-shaped groove 15 having sides 57.7° with respect to the top surface of the silicon. The oxide coating 22 is now grown to a thickness of about 500 Å. Next the remaining nitride layer 32 is removed by an etchant which attacks nitride but not silicon oxide, then the oxide 31 is removed by etching. The gate oxide 29 is grown by thermal oxidation to a thickness of about 800 to 1000 Å. In areas of the slice where depletion load devices are required, although not pertinent to this invention, a masked ion implant step would be done at this point. Likewise, the threshold voltage of the enhancement mode transistors Q in the cell array or periphery may be adjusted by ion implant. Also, windows for polysilicon to silicon contacts 18 are patterned and etched at this point using a photoresist mask.

As seen in FIG. 4c a layer of photocrystalline silicon is deposited over the entire slice in a reactor using standard techniques. The polysilicon layer is patterned by applying a layer of photoresist, exposing to ultraviolet light through a mask prepared for this purpose, developing, then etching both polysilicon and thin oxide exposed at the contact 20. The remaining parts of the polysilicon layer provide what will be the segments 17, the gates 11 for the transistors Q in the array, as well as the line 14.

An N+ diffusion operation is now performed to heavily dope the remaining polysilicon and to form N+ regions beneath the contact area 16 and 20. Diffusion is masked by the thin oxide 22. A thick layer 28 of low temperature deposited oxide is then applied.

The metal contacts and interconnections are made in the usual manner by depositing a thin film of aluminum over the entire top surface of the slice then patterning it by a photoresist mask and etch sequence, leaving metal strips 19.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore contemplated that the appended claims will cover any such modifications or embodiments as fall within the true scope of the invention.

I claim:

1. An electrically programmable semiconductor device comprising an array of rows and columns of cells, each cell including: a V-shaped groove in a face of a semiconductor body, a thin insulating coating on said face in said groove, and a conductive layer over said coating; some of said cells of the device having an electrical short through said coating at the apex of the groove and other of said cells having no such electrical short.

2. A device according to claim 1 wherein the semiconductor body is silicon.

3. A device according to claim 2 wherein the groove is anisotropically etched into the (100) plane.

4. A device according to claim 2 wherein the conductive layer is polycrystalline silicon and the coating is silicon oxide.

5. A device according to claim 4 wherein the silicon body includes an N+ substrate and a highly resistive epitaxial layer.

6. A device according to claim 5 wherein an N-channel MOS transistor is connected in series with said conductive layer at said face for each cell.

7. A device according to claim 6 wherein said transistor has a gate oxide thickness greater than said insulating coating.

8. An electrically programmable semiconductor device comprising an array of rows and columns of cells at a face of a semiconductor body, each cell including a controlled switching device and a potentially shorted element, the potentially shorted element having an upper conductive layer and a lower conductive area of said face, the upper conductive layer being separated from the lower conductive area by a thin dielectric; some of the cells of said device having an electrical short through said dielectric and other of said cells having no such electrical short.

9. A device according to claim 8 wherein said controlled switching device in each of said cells is an insulated gate field effect transistor.

10. A device according to claim 9 wherein gates of all of said transistors in each row are connected in common as a row line.

11. A device according to claim 10 each transistor has a source-to-drain path connected in series between a column line and said upper conductive layer in each cell.

12. A device according to claim 11 wherein each of said potentially shorted elements includes a V-shaped groove in said face and the electrical short through said dielectric is at the apex of said groove.

* * * * *